(12) United States Patent
McNamara

(10) Patent No.: US 9,407,211 B1
(45) Date of Patent: Aug. 2, 2016

(54) HIGH POWER AND HIGH LINEARITY CASCODE AMPLIFIER

(71) Applicant: M/A-COM Technology Solutions Holdings, Inc., Lowell, MA (US)

(72) Inventor: Brian J. McNamara, Windham, NH (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 0 days.

(21) Appl. No.: 14/952,181

(22) Filed: Nov. 25, 2015

Related U.S. Application Data

(63) Continuation of application No. 14/177,849, filed on Feb. 11, 2014, now Pat. No. 9,231,537.

(51) Int. Cl.
| H03F 1/22 | (2006.01) |
| H03F 1/56 | (2006.01) |
| H03F 3/26 | (2006.01) |
| H03F 3/16 | (2006.01) |

(52) U.S. Cl.
CPC .............. *H03F 1/223* (2013.01); *H03F 1/56* (2013.01); *H03F 3/26* (2013.01); *H03F 1/22* (2013.01); *H03F 1/226* (2013.01); *H03F 3/16* (2013.01); *H03F 2200/129* (2013.01)

(58) Field of Classification Search
CPC ............... H03F 3/26; H03F 3/21; H03F 1/22; H03F 1/226; H03F 1/34; H03F 1/342; H03F 2200/06; H03F 2200/09; H03F 2200/144; H03F 2200/534; H03F 2200/537; H03F 2200/541; H03F 3/16
USPC .................................. 330/277, 300, 307, 311
See application file for complete search history.

(56) References Cited

U.S. PATENT DOCUMENTS

| 4,473,780 | A | * | 9/1984 | Gent ......................... H03F 1/42 330/311 |
| RE32,132 | E | | 4/1986 | Nakamura et al. ............ 330/300 |
| 4,706,038 | A | | 11/1987 | Navidi et al. ................. 330/311 |
| 4,754,233 | A | | 6/1988 | Pickett ......................... 330/311 |
| 6,011,438 | A | | 1/2000 | Kakuta et al. ................. 330/271 |
| 6,107,885 | A | | 8/2000 | Miguelez et al. ............. 330/311 |
| 6,204,728 | B1 | * | 3/2001 | Hageraats ................ H03F 1/22 330/311 |
| 6,496,069 | B1 | | 12/2002 | Van De Westerlo .......... 330/311 |
| 2013/0229237 | A1 | * | 9/2013 | Takenaka .................. H03F 1/22 330/311 |

* cited by examiner

*Primary Examiner* — Khanh V Nguyen
(74) *Attorney, Agent, or Firm* — Christopher P. Maiorana, PC

(57) ABSTRACT

An apparatus having a first circuit and a second circuit. The first circuit may be configured to generate an output signal in response to an intermediate signal. The first circuit may be implemented using a first transistor type. The second circuit may be configured to generate the intermediate signal in response to (i) an input signal and (ii) a feedback of the output signal. The second circuit may be implemented using a second transistor type. The output signal is an amplified version of the input signal while maintaining linearity.

18 Claims, 9 Drawing Sheets

HIGH POWER AND HIGH LINEARITY CASCODE AMPLIFIER

This application relates to U.S. Ser. No. 14/177,849, filed Feb. 11, 2014, which is incorporated by reference in its entirety.

FIELD OF THE INVENTION

The present invention relates to amplifiers generally and, more particularly, to a method and/or apparatus for implementing a high power and high linearity cascode amplifier.

BACKGROUND OF THE INVENTION

Conventional Gallium Nitride (GaN) amplifier solutions offer high power performance, especially by enabling performance at high voltage. GaN solutions do not offer a linear response over a wide range of frequencies. Conventional heterojunction bipolar transistor (HBT) devices provide a linear response over a wide range of frequencies, but only operate with limited supply voltages. HBT devices have limited power levels. In the conventional approaches, an all FET (field-effect transistor) common source drain with a FET common gate configuration can be used to implement an amplifier.

It would be desirable to provide a power amplifier with improved linearity implemented using GaN devices.

SUMMARY OF THE INVENTION

The present invention concerns an apparatus having a first circuit and a second circuit. The first circuit may be configured to generate an output signal in response to an intermediate signal. The first circuit may be implemented using a first transistor type. The second circuit may be configured to generate the intermediate signal in response to (i) an input signal and (ii) a feedback of the output signal. The second circuit may be implemented using a second transistor type. The output signal is an amplified version of the input signal while maintaining linearity.

The objects, features and advantages of the present invention include providing an amplifier that may (i) provide high power output, (ii) provide a linear response over a target range of frequencies, (iii) be implemented using HBT and GaN transistors, (iv) implement a cascode configuration, (v) provide high power and high voltage characteristics of a GaN implementation, (vi) provide linear and/or gain characteristics of a HBT implementation, (vii) provide current amplification and/or voltage amplification on the same package, (viii) improve broadband performance of the topology by raising input impedance to allow broadband matching, (ix) provide the combination of a low voltage driver stage with a high voltage output device, and/or (x) be implemented on an integrated circuit package.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

In an example embodiment, one transistor type, such as bipolar transistors (or heterojunction bipolar transistors), may be used to implement an input stage. In another example, the input stage may be implemented using a Darlington configuration. In one example, another transistor type, such as a high breakdown voltage FET, may be used to implement an output stage. In general, the high breakdown voltage FET may include pHEMT (pseudomorphic high electron mobility transistor) and/or HFET (heterostructure field-effect transistor) technology capable of providing high breakdown voltages. In one example, a GaN HEMT (high electron mobility transistor) may be used to implement the output stage. In general, HBT devices may have a maximum operating voltage of 5V allowing signal swings of approximately 10V. In general, a high breakdown voltage may be considered to be a breakdown voltage of greater than 10V. For example, GaN devices offer breakdown and operating voltages greater than 50V. Such an implementation takes advantage of each of the benefits of each transistor technology. In one example, the bipolar transistors may provide current amplification. In another example, the GaN HEMT may provide voltage amplification. In one implementation, the two processes may be fabricated on different substrates, then bonded together using bond wires to make one integrated circuit (IC) package. In general, the GaN transistors may not provide a linear response over a wide range of frequencies. Pairing the GaN transistors with one or more bipolar transistors may be used to implement a power amplifier with a linear response over a wide range of frequencies and/or bandwidth matching.

Embodiments of the invention may be implemented to pair the high voltage and/or high power characteristics of GaN devices with the linear response and/or gain characteristics of HBT devices. In one example, GaN and HBT devices may be combined in a cascode arrangement where a high output voltage is spread across the common gate GaN field-effect transistor (FET) which is driven by a common emitter HBT. In a cascode arrangement, the HBT device may experience a limited voltage swing, even with a very large voltage swing at the GaN FET output. The cascade arrangement may take advantage of each of the benefits of each type of transistor. For example, the bipolar transistors may provide current amplification. The GaN transistor may provide voltage amplification. GaN transistors may be used for the output stage. The HBT device has a linear conductance, $G_m$. Use of a Darlington configuration at the HBT driving stage further improves broadband performance of the topology by raising input impedance to allow broadband matching. In addition, the HBT device offers low knee voltage which keeps more voltage available for the GaN device to maximize output power.

Figure 1:
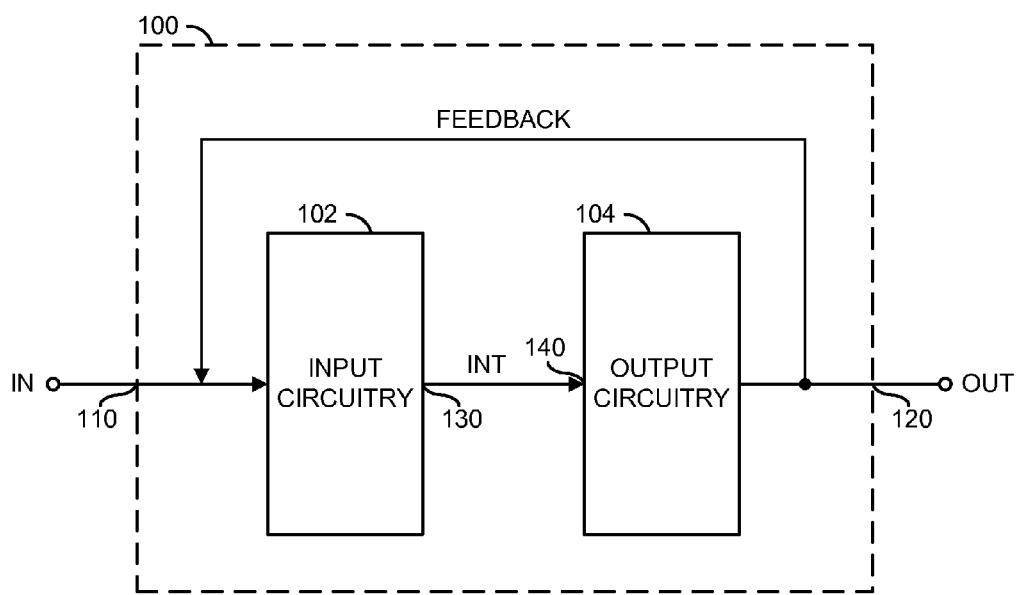
FIG. 1 is a block diagram illustrating an example embodiment.

Referring to FIG. 1, a block diagram of a circuit 100 is shown illustrating an example embodiment of the invention. The circuit 100 (or device, or integrated circuit, or system) 100 may be implemented as an amplifier. The circuit 100 generally comprises a block (or circuit) 102, and a block (or circuit) 104. The circuit 102 may be an input stage (or input circuitry). The circuit 104 may be an output stage (or output circuitry). The circuit 100 may have an input 110 that receives a signal (e.g., IN), and an output (e.g., 120), that may present a signal (e.g., OUT). The signal OUT may be an amplified version of the signal IN. The signal OUT may maintain a linear response compared with the signal IN.

The circuit 102 may have an output 130 that may present a signal (e.g., INT). The signal INT may be transferred to an input 140 of the circuit 104. The signal INT generally conveys an amplified version of the signal IN from the circuit 102 to the circuit 104 while maintaining a linear response. The circuit 102 may provide current amplification. In one example, the circuit 102 may be implemented as a bipolar transistor, such as an HBT. The circuit 104 may present the signal OUT. The signal OUT may be an amplified version of the signal INT. The circuit 104 may provide voltage amplification. In one example, the circuit 104 may be implemented as a high breakdown voltage FET, such as a GaN transistor.

A signal (e.g., FEEDBACK) is shown connected from the circuit 104 to the circuit 102. The signal FEEDBACK may be a feedback of the signal OUT presented to the circuit 102. The signal FEEDBACK may be used to set target radio frequency (RF) gain and/or impedance levels. In the example shown, 4 volts may be presented to the GaN transistor at the gate. The gate absorbs voltages of approximately 1 volt. 19 volts is left available to power the GaN transistor.

Figure 2:
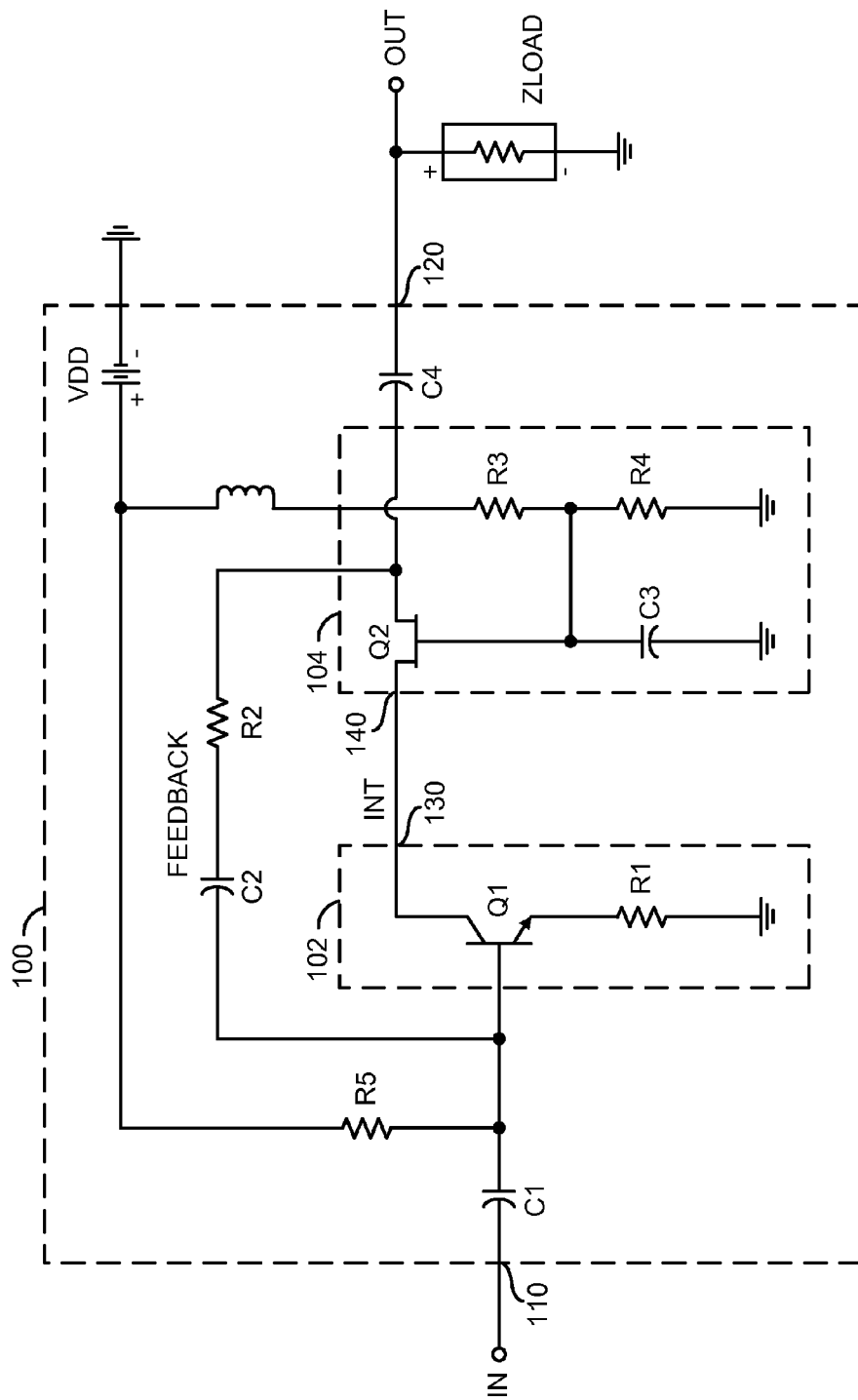
FIG. 2 is a circuit diagram illustrating a single-ended implementation of a cascode amplifier.

Referring to FIG. 2, a more detailed diagram of the circuit 100 is shown. The circuit 100 illustrates a single-ended implementation. The circuit 102 generally comprises a transistor Q1 and a resistor R1. The transistor Q1 may be an HBT transistor. The transistor Q1 may be connected in a common emitter configuration. The resistor R1 may set an RF gain and/or an impedance level.

The circuit 104 generally comprises a transistor Q2, a resistor R3, a resistor R4, and/or a capacitor C3. In one example, the transistor Q2 may be implemented as a GaN transistor. The transistor Q2 may be configured in a common gate configuration. The resistors R3 and/or R4 may set a desired voltage at the gate of the transistor Q2. The capacitor C3 may provide RF ground for a common gate operation.

The signal IN may be presented to a base of the transistor Q1 through a capacitor C1. The signal IN and the signal FEEDBACK may be presented to the transistor Q1 through a capacitor C2 and/or a resistor R2. The signal INT may be generated by the circuit 102. The signal INT may be generated by the collector of the transistor Q1. The signal INT may be connected between the collector of the transistor Q1 and the source of the transistor Q2. The drain of the transistor Q2 may generate the signal OUT. The signal OUT may be presented as the output 120 of the circuit 100. The various passive components shown may provide target DC bias conditions and/or may set gain and/or impedance levels.

The circuit 100 may split a high DC supply voltage VDD across the transistor Q2 and/or the transistor Q1. In general, HBT transistors do not operate with high collector voltages. In order to limit the collector voltage of transistor Q1, the gate of the transistor Q2 may be set to a target low voltage with the resistor R3 and/or the resistor R4. The voltage drop from gate to source of the transistor Q2 (Vgs) may be set by intrinsic characteristics of the GaN transistor (e.g., based on operating current, etc.). The gate to source voltage Vgs is typically in the range of −1V to −2V. By setting the voltage at the gate of the transistor Q2, an optimally large amount of supply voltage may be generated across the high voltage transistor Q2 while keeping voltage on the collector of the transistor Q1 low enough for reliable operation while still high enough for optimal linear performance.

In a typical target application, such as a cable television (CATV) infrastructure, the supply voltage VDD may be 24V. The collector voltage of the transistor Q1 may be set to approximately 5V. The output of the transistor Q2 may then have 19V available. Even under large RF signal conditions (and high RF currents) the voltage swing at the collector of the transistor Q1 may be relatively small because of the high transconductance of the transistor Q2.

The current through transistor Q1 and/or the transistor Q2 may be set by the amount of current presented to the base of the transistor Q1. Such current may be defined by the following current gain formula:

$$\beta = Ic/Ib$$

The base current may be set by sizing a resistor R5. In more robust implementations, the resistor R5 may be replaced with more bias networks to set a constant base current when there is potential variation in temperature, resistor values and/or β.

The resistors R1 and/or R2 may provide feedback to set a desired RF gain and/or impedance level. The capacitor C3 may provide an RF ground for common gate operation. The capacitors C1, C2 and/or C4 may provide DC blocking. The inductor L1 may provide high RF impedance with low DC resistance to feed supply voltage and/or current to the amplifier.

Figure 3:
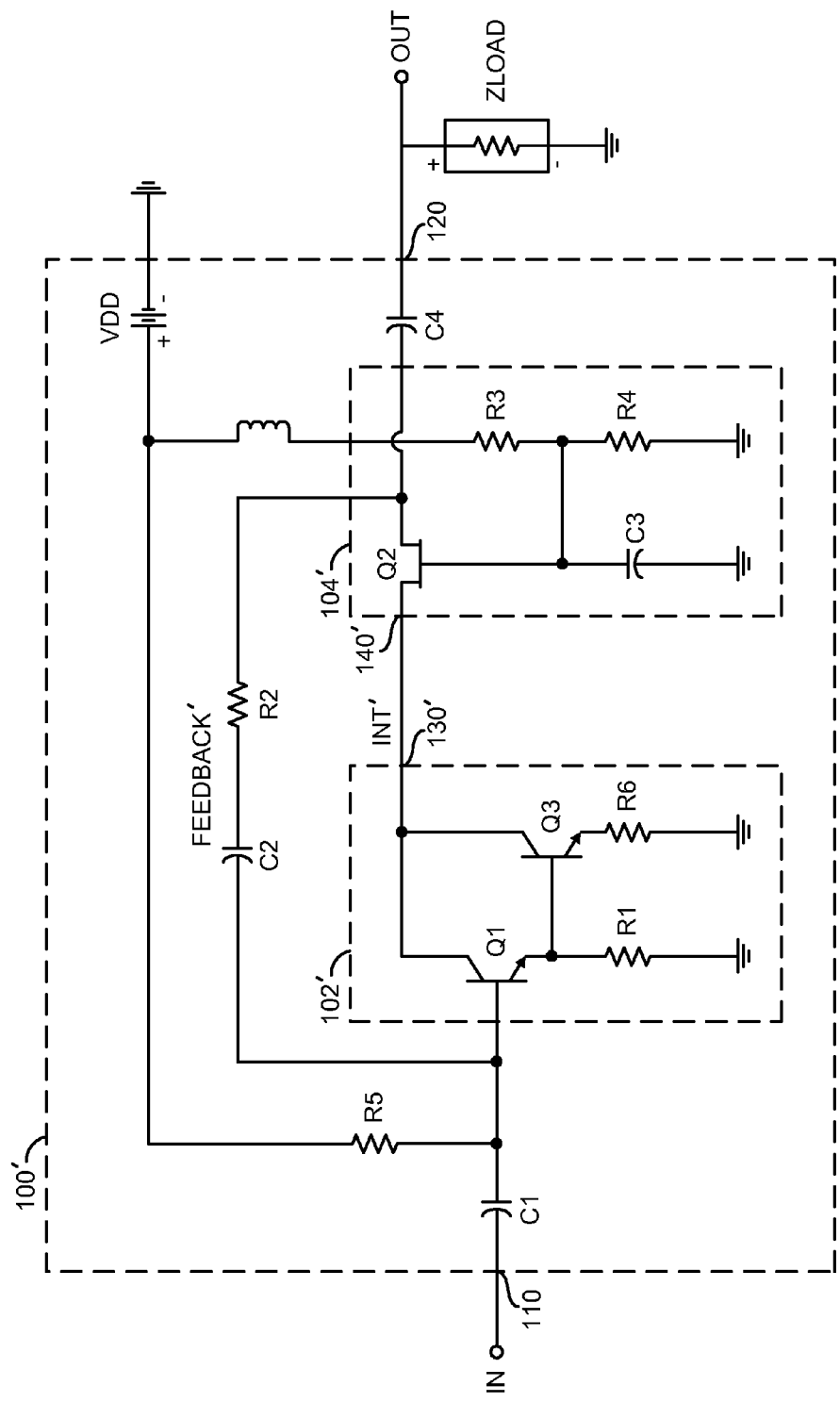
FIG. 3 is a diagram illustrating a cascode implementation using a Darlington pair of transistors.

Referring to FIG. 3, a diagram of a circuit 100' is shown. The circuit 100' is shown illustrating a cascode implementation using a Darlington pair of transistors. The circuit 100' generally comprises a circuit 102' and a circuit 104'. The circuit 102' may include the transistor Q1 and a transistor Q3, arranged in a Darlington configuration. The transistor Q1 may be configured as a pre-driver transistor. The transistor Q3 may be configured as a driver transistor. In a Darlington configuration, the transistor Q1 may be a small transistor that may drive the transistor Q3. The transistor Q3 may be implemented as a primary common emitter device with a shared collector terminal. The shared collector terminal may generate a signal (e.g., INT') at the output 130' of the circuit 102'.

A resistor R6 may have one end connected to ground and the other end connected to the emitter of the transistor Q3. The resistor R6 may allow the adjustment of DC current in the transistor Q3. The resistor R1 may have one end connected to the base of the transistor Q3 and the emitter of the transistor Q1, and the other end connected to ground. The resistor R1 may allow an additional discharge path for the charges stored in the base of the transistor Q3. The resistor R1 may allow independent adjustment of the DC current in the transistor Q1.

The Darlington configuration shown is common in bipolar transistor amplifiers. The Darlington configuration may provide benefits desired for larger devices in power amplification (e.g., higher gain, broader bandwidth, better noise figure, and higher input impedance).

The circuit 104' may have a configuration similar to the circuit 104. An input 140' of the circuit 104' may receive the signal INT'. The circuit 104' may present the signal OUT. The signal OUT may be an amplified version of the signal INT'. A signal (e.g., FEEDBACK') is shown connected from the circuit 104' to the circuit 102'. The signal FEEDBACK' may be a feedback of the signal OUT presented to the circuit 102'. The signal FEEDBACK' may be used to set target radio frequency (RF) gain and/or impedance levels.

Figure 4:
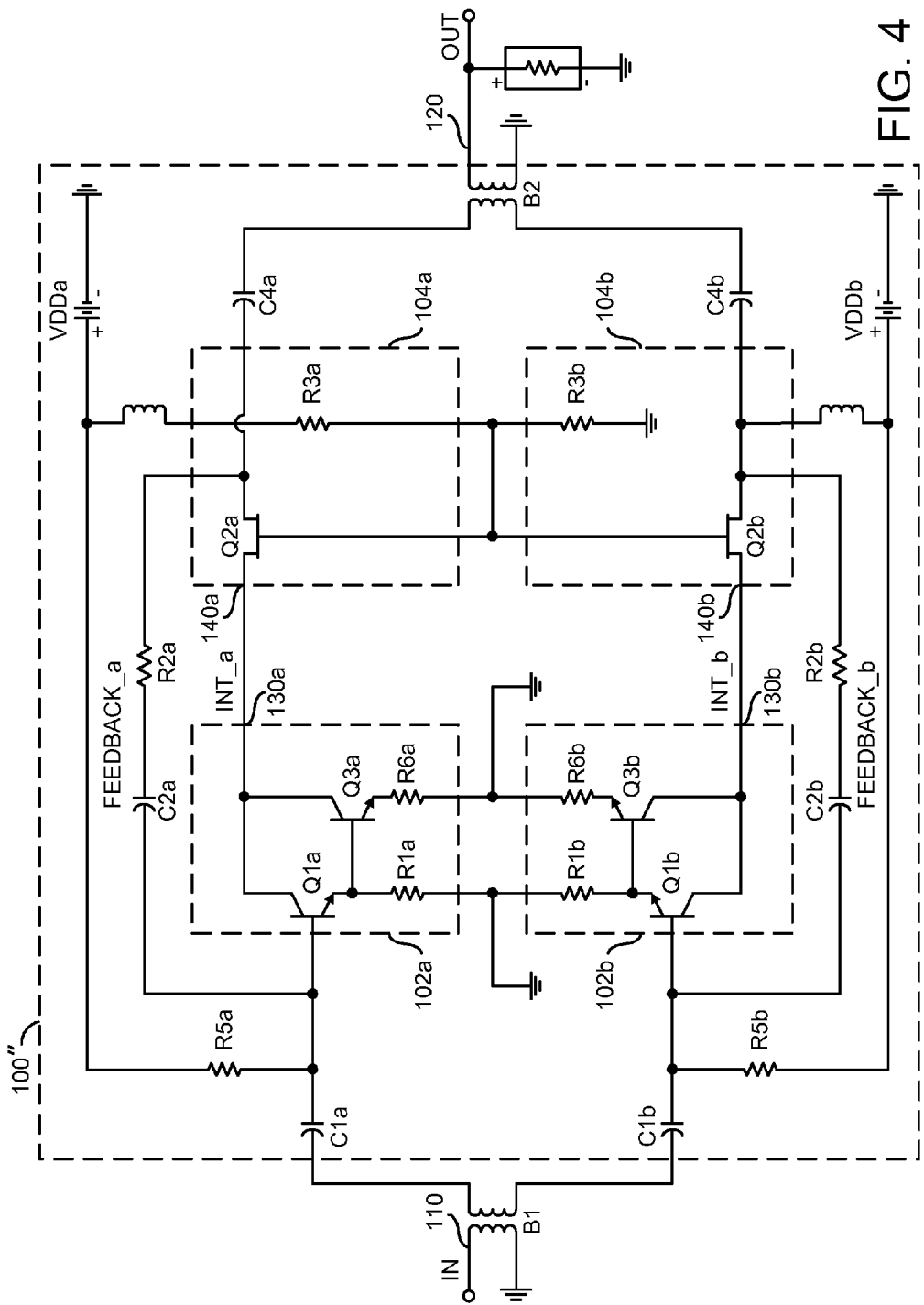
FIG. 4 is a diagram illustrating a Darlington cascade amplifier with two amplifiers driven in Push-Pull configuration.

Referring to FIG. 4, a diagram of a circuit 100" is shown. The circuit 100" illustrates a Darlington cascode amplifier with two amplifiers driven in Push-Pull configuration. A balun (e.g., B1) may be used at the input 110. A balun (e.g., B2) may be used at the output 120. The baluns B1 and/or B2 may allow for a balanced operation. A capacitor at the common gate of the GaN transistors Q2a and/or Q2b in circuits 104a and 104b may not be needed because of the virtual ground created by the balanced operation. A circuit 102a may include a transistor Q1a and a transistor Q3a. A circuit 102b may include a transistor Q1b and a transistor Q3b. The transistors Q1a/Q3a and/or the transistors Q1b/Q3b may be arranged in the Darlington configuration.

The balun B1 may present input signals of opposite phase to the Darlington pair circuits 102a and 102b. Capacitors (e.g., C1a and/or C1b) may allow for fine tuning of the input impedance. The shared collector terminal of the Q1a and/or Q3a transistors of the circuit 102a may generate a signal (e.g., INT_a) at an output 130a of the circuit 102a. The shared collector terminal of the Q1b and/or Q3b transistors of the circuit 102b may generate a signal (e.g., INT_b) at an output 130b of the circuit 102b. Resistors (e.g., R1a and/or R1b) may allow each Darlington pair of transistors in the circuits 102a and/or 102b to rapidly discharge stored charges. The resistors R1a and/or R1b may allow for independent adjustments to the DC current through the transistors Q1a and/or Q1b. Resistors (e.g., R6a and/or R6b) may join the emitter of the transistors Q3a and Q3b to create an additional path for adjustment of the AC current in the transistors Q3a and/or Q3b.

The signal INT_a may be presented to an input 140a of the circuit 104a. The signal INT_b may be presented to an input 140b of the circuit 104b. The circuit 104a may generate a signal (e.g., FEEDBACK_a). The signal FEEDBACK_a may be presented to the circuit 102a. The signal FEEDBACK_a may be provided through an RC network (e.g., R2a and/or C2a). The circuit 104b may generate a signal (e.g., FEEDBACK_b). The signal FEEDBACK_b may be presented to the circuit 102b. The signal FEEDBACK_b may be provided through an RC network (e.g., R2b and/or C2b). The circuit 104a may be in-phase with the circuit 102a. The circuit 104b may be in-phase with the circuit 102b. The circuits 102a and 104a may be out-of-phase with the circuits 102b and 104b.

A DC voltage source (e.g., VDDa) may be connected to the input of the circuit 102a through a resistor network (e.g., R5a) to provide bias voltage for the transistors Q1a and/or Q3a. A DC voltage source (e.g., VDDb) may be connected to the input of the circuit 102b through a resistor network (e.g., R5b) to provide bias voltage for the transistors Q1b and/or Q3b. The DC voltage sources VDDa and/or VDDb may be connected to the balun B2. The output of the circuit 104a and/or the output of the circuit 104b may be presented to the balun B2. The balun B2 may generate the signal OUT.

The balun B1 may present an input signal of increasing amplitude to the circuit 102a and an input signal of decreasing amplitude to the circuit 102b. An increasing current may be drawn from the DC voltage sources VDDa through the transistor Q2a. A decreasing current may be drawn from the DC voltage source VDDb through the transistor Q2b. The total resultant output through the balun B2 may be the sum of the charge flow through the balun B2. A corresponding response occurs when the balun B1 presents an input signal of decreasing amplitude to the circuit 102a and an input signal of decreasing amplitude to the circuit 102b.

Referring to FIGS. 5-8, simulation results are shown for the amplifier 100 described in FIG. 2. The simulation results indicate the benefits of the cascode topology. The benefits of the cascode topology may include enabling the combination of a low voltage driver stage with a high voltage output device. Mixing the HBT and GaN technologies may provide the benefits of each process. GaN technology may support large voltage operations. HBT technology may provide a linear response and/or lower cost.

Figure 5:
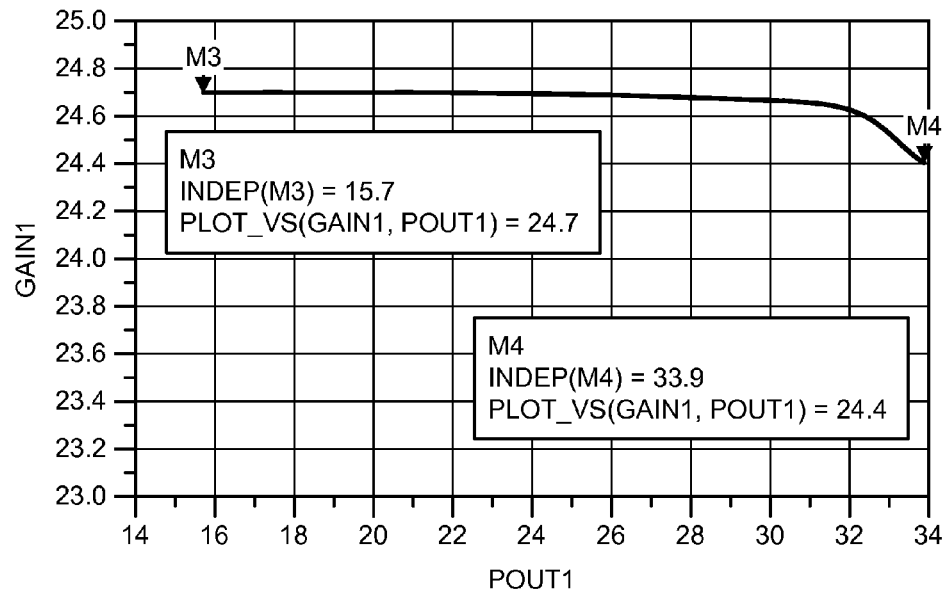
FIG. 5 is a graph illustrating the gain against output power for the amplifier described in FIG. 2 with a simulation frequency of 500 MHz.

Referring to FIG. 5, a graph illustrating the gain against output power for the amplifier 100 described in FIG. 2 with a simulation frequency of 500 MHz is shown. The X axis of the graph may represent the output power (e.g., POUT1) of the circuit 100 measured in dBm. The Y axis of the graph may represent the gain (e.g., GAIN1) of the circuit 100 measured in dB.

A point M3 may represent a point on the graph where GAIN1 is 24.7 dB, and POUT1 is 15.7 dBm. A point M4 may represent a point on the graph where GAIN1 is 24.4 dB, and POUT1 is 33.9 dBm. The input power is swept until the gain begins to compress (is reduced). Gain compresses when output power is beyond the linear operating region of the amplifier, as indicated by the point M4. The points M3 and M4 may indicate the limits of output power where the amplifier 100 remains linear.

Figure 6:
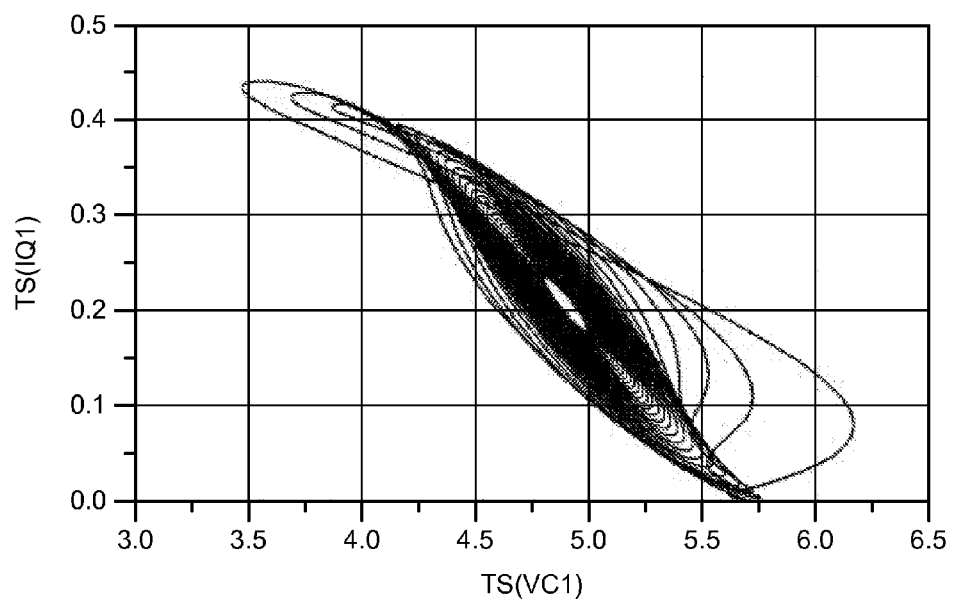
FIG. 6 is a graph illustrating the current through a HBT transistor Q1 against the voltage at a collector over a range of simulated input power levels for the amplifier described in FIG. 2.

Referring to FIG. 6, a graph illustrating the current through a HBT transistor Q1 against the voltage at a collector over a range of simulated input power levels for the amplifier 100 described in FIG. 2 is shown. The X axis of the graph may represent the voltage (e.g., VC1) at the collector of the transistor Q1 measured in volts. The Y axis of the graph may represent the current (e.g., IQ1) of the transistor Q1 measured in amperes.

The voltage VC1 at the collector of the transistor Q1 is shown ranging from approximately 3.5V to 6V. Even as the full amplifier enters gain compression, the voltage swing may generally be less than +/−1.5V beyond a small signal operating point. Since HBT devices can not operate with high collector voltages, the graph indicates that an HBT device may still be able to operate with the configuration described in the circuit 100.

Figure 7:
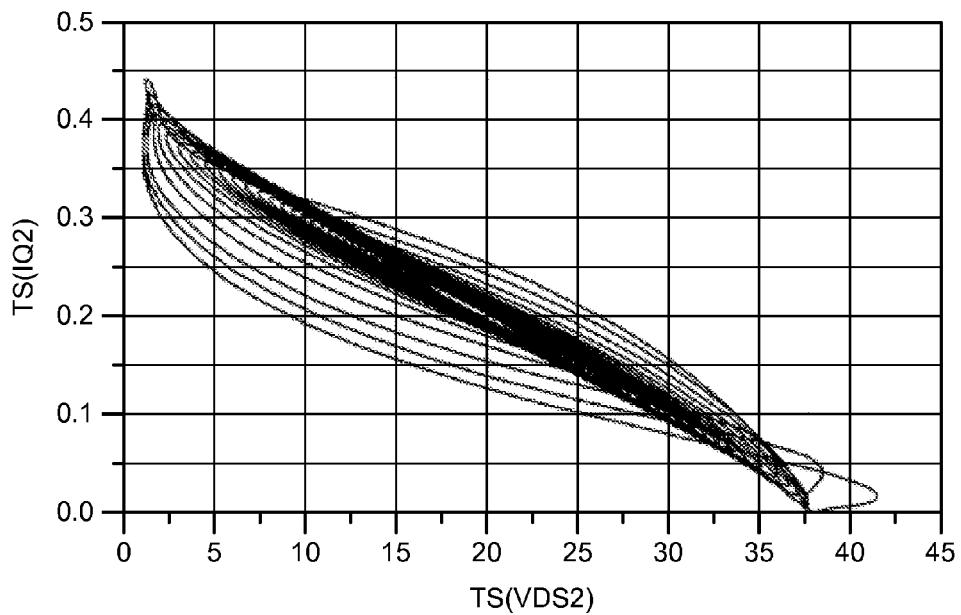
FIG. 7 is a graph illustrating the current through a GaN transistor Q2 against a drain to source voltage over a range of simulated input power levels for the amplifier described in FIG. 2.

Referring to FIG. 7, a graph illustrating the current through the GaN transistor Q2 against a drain to source voltage over a range of simulated input power levels for the amplifier 100 described in FIG. 2 is shown. The X axis may represent the drain to source voltage (e.g., VDS2) across the transistor Q2 measured in volts. The Y axis may represent the current (e.g., IQ2) of the transistor Q2 measured in amperes.

The drain to source voltage VDS2 across the transistor Q2 is shown from an initial small signal value of 19V as having a range from as low as 1V up to 41V. The large voltage swing range indicates that the transistor Q2 may provide high power and high voltage amplification with the configuration described in the circuit 100.

Figure 8:
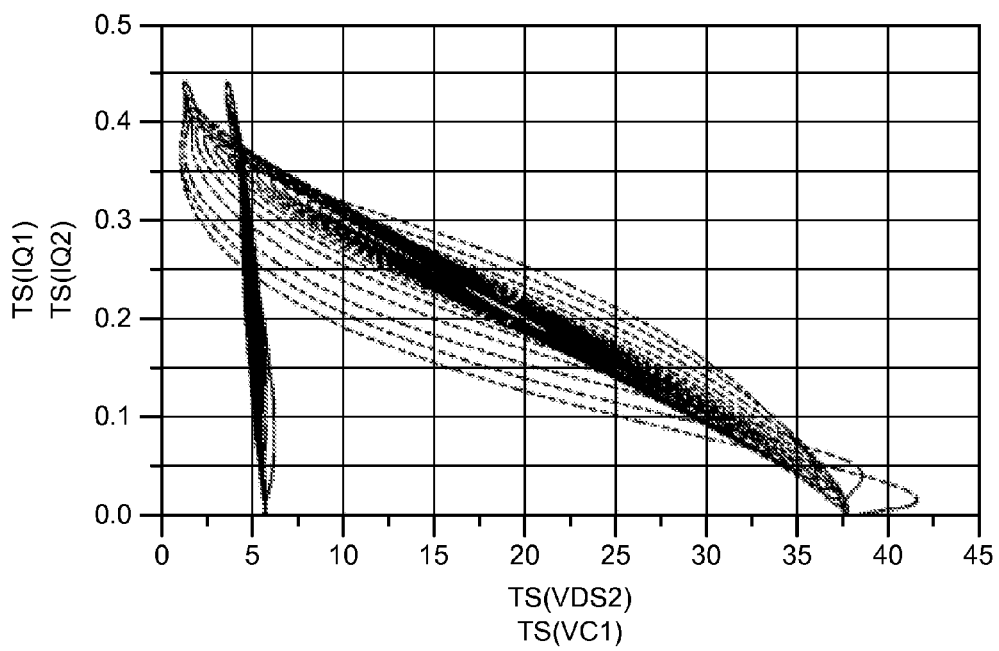
FIG. 8 is a graph illustrating the current against the voltage for the transistors Q1 and Q2 on the same plot for the amplifier described in FIG. 2.

Referring to FIG. 8, a graph illustrating the current against the voltage for the transistors Q1 and Q2 on the same plot for the amplifier 100 described in FIG. 2 is shown. The X axis may represent VC1 for the transistor Q1 and VDS2 for the transistor Q2 measured in volts. The Y axis may represent IQ1 for the transistor Q1 and IQ2 for the transistor Q2 measured in amperes.

The plot indicates that the voltage of the transistor Q1 is relatively constant compared to the voltage swing for the output transistor Q2. With the cascode configuration described in the circuit 100, a low voltage HBT driver device may safely be chosen which has high gain and a linear response in combination with a high breakdown voltage common gate device.

Figure 9:
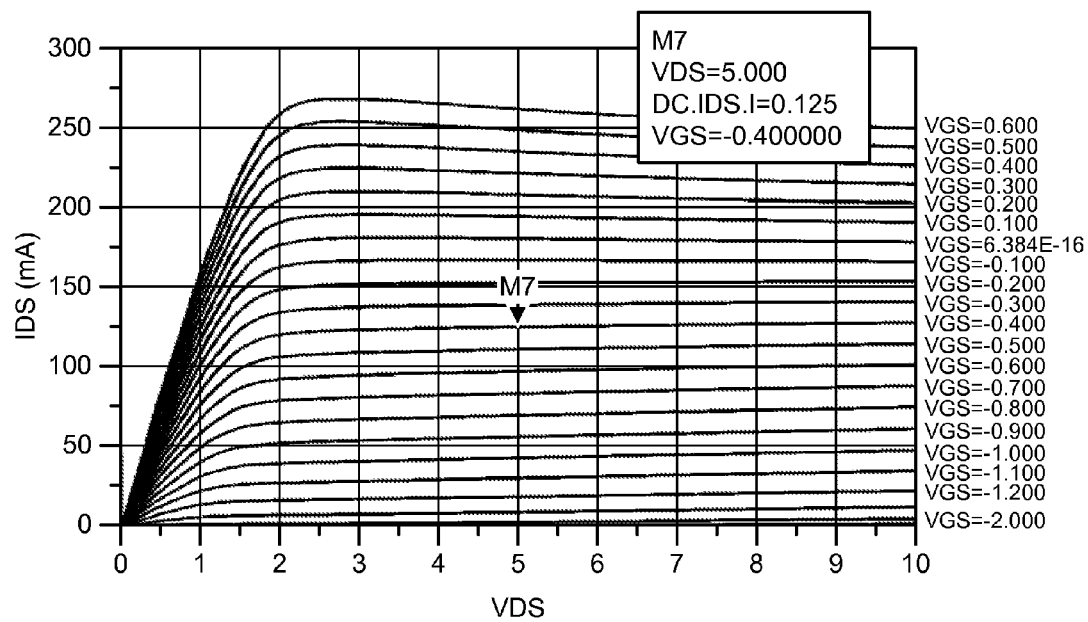
FIG. 9 is a graph illustrating currents through a pHEMT device versus drain-to-source voltages of the pHEMT over a range of gate bias voltages.

Referring to FIG. 9, a graph illustrating currents through a pHEMT device versus drain-to-source voltages over a range of gate bias voltages is shown. The pHEMT device may be a 1 mm pHEMT device. The X axis represents a drain-to-source voltage (e.g., VDS) measured in volts. The Y axis represents a current (e.g., IDS) measured in milliamperes. Each curve on the graph represents a DC I-V curve at a particular gate bias voltage (e.g., VGS). In one example, a point M7 represents a point on a curve with a VGS of −0.4V. At the point M7 the VDS value may be 5.0V, and the IDS value may be 125 mA.

Figure 10:
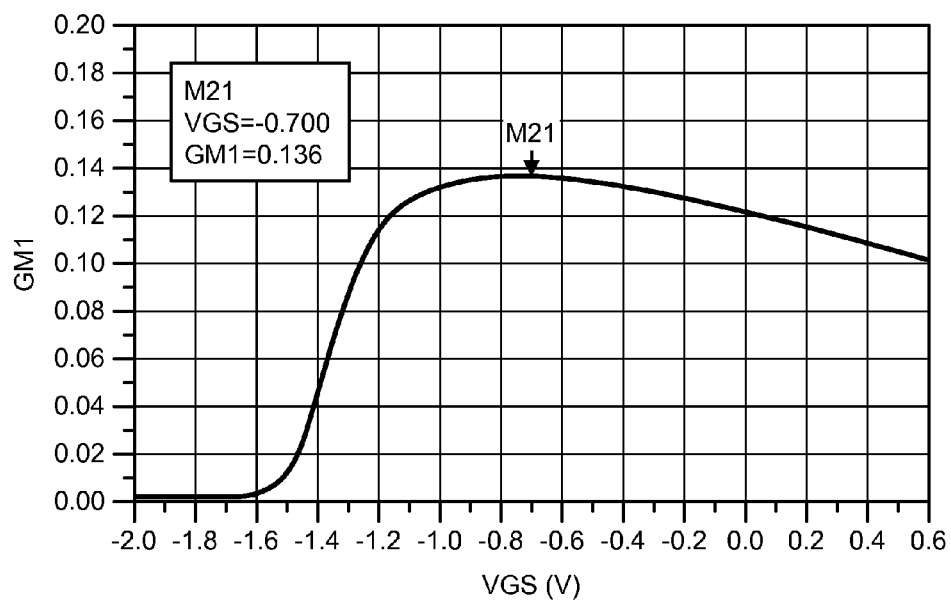
FIG. 10 is a graph illustrating transconductance versus gate bias voltage for a pHEMT.

Referring to FIG. 10, a graph illustrating transconductance against gate bias voltage for the pHEMT is shown. The X axis represents a gate bias voltage VGS measured in volts. The Y axis may represent a transconductance (e.g., GM1). Transconductance is a ratio change in current divided by change in gate bias voltage. The transconductance GM1 is calculated at the VDS value of 5V. A point M21 may represent a point where the VGS is −0.7V and the transconductance GM1 is 0.136. Transconductance is directly correlated to device gain. Generally, for linear operation the transconductance may be nearly constant over a range of input signal levels.

Figure 11:
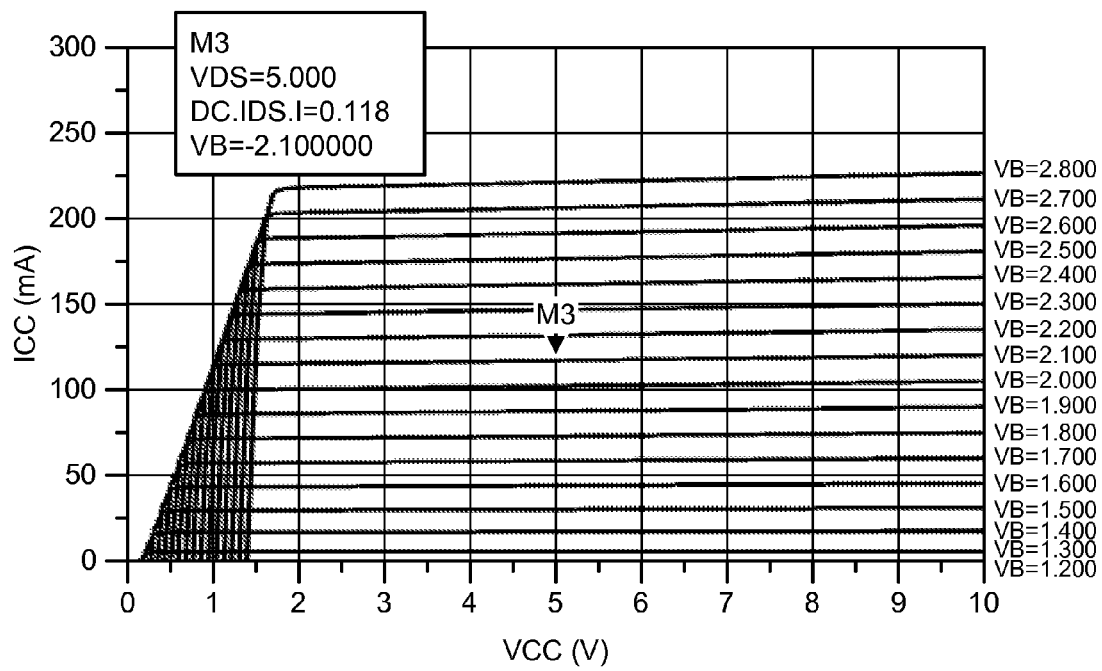
FIG. 11 is a graph illustrating currents through an HBT device versus voltages of the HBT device over a range of base bias voltages.

Referring to FIG. 11, a graph illustrating currents through an HBT device against voltages of the HBT device over a range of base bias voltages. The HBT device may be a 1280 μm² HBT device. The HBT device may be sized to handle the same 5V and/or 125 mA as the pHEMT. The X axis may represent a voltage (e.g., VCC) for the HBT device measured in volts. The Y axis may represent a current (e.g., ICC) through the HBT device measured in milliamperes. Each curve on the graph may represent a DC I-V curve at a particular base bias voltage (e.g., VB). In one example, a point M3 may represent a point on a curve with a VB of −2.1V. At the point M7 the VCC value may be 5.0V, and the IDS value may be 118 mA.

Figure 12:
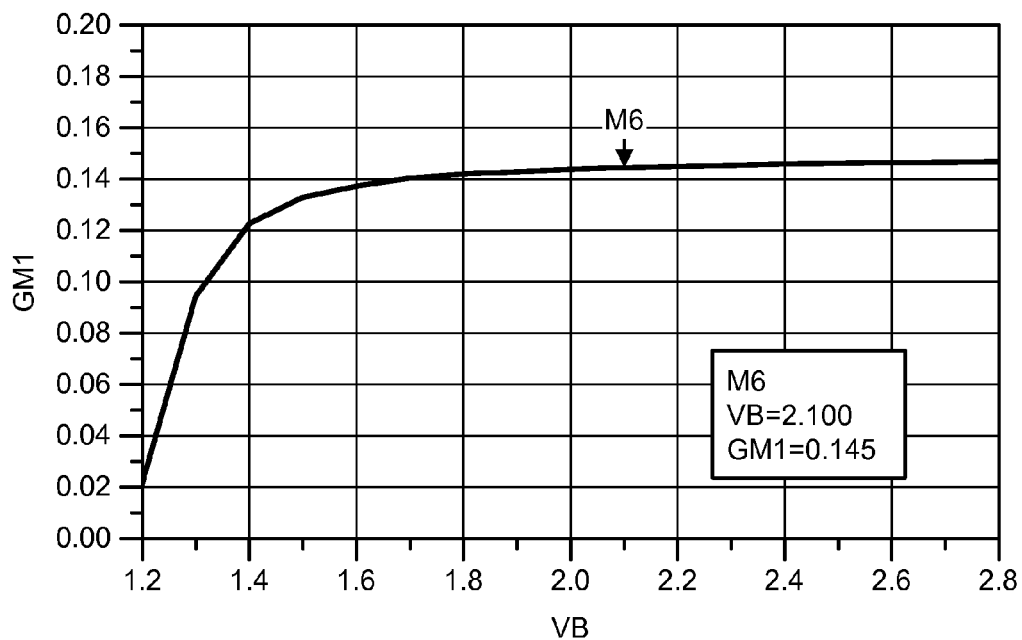
FIG. 12 is a graph illustrating transconductance versus base bias voltage for an HET device.

Referring to FIG. 12, a graph illustrating transconductance against base bias voltage for the HBT device. The X axis may represent a base bias voltage VB measured in volts. The Y axis may represent a transconductance GM1. The transconductance GM1 is calculated at the VDS value of 5V. A point M6 may represent a point where the VB is 2.1V and the transconductance GM1 is 0.145.

The HBT device (described in FIG. 10) may include emitter resistance to yield a similar peak transconductance GM1 as the pHEMT device (described in FIG. 12). Comparing the graphs described in FIGS. 11 and 12 with the graphs described in FIGS. 9 and 10, the HBT device has a relatively constant current and transconductance compared to the pHEMT. The relatively constant current and transconductance may yield a relatively constant and linear gain for the HBT device.

Figure 13:
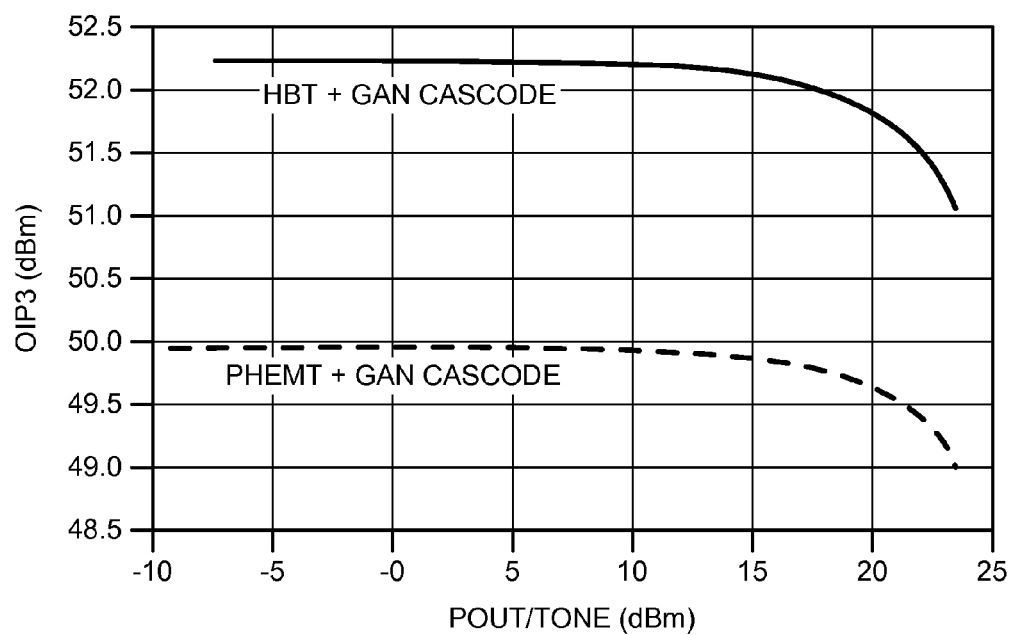
FIG. 13 is a graph illustrating output third order intermodulation intercept of cascode arrangements.

Referring to FIG. 13, a graph illustrating output third order intermodulation intercept of cascode arrangements. Output third order intermodulation intercept is a common measure of linearity. The X axis may represent an output power (e.g., POUT) measured in dBm. The Y axis may represent an output third order intermodulation intercept (e.g., OIP3) measured in dBm. The dashed line curve may represent an amplifier configured in a cascode arrangement comprising a pHEMT at the driver stage and a GaN device at the output stage. The solid line curve may represent an amplifier configured in a cascode arrangement comprising an HBT device at the driver stage and a GaN device at the output stage, similar to the circuit 100. Both amplifiers may operate with a 24V supply and 200 mA. The HBT device and GaN device arranged in a cascode arrangement provides a 2.5 dB improvement in output third order intermodulation intercept over the cascode arrangement implemented with a pHEMT at the driver stage. The improvement in output third order intermodulation intercept indicates improved linear gain.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to (a) generate an output signal in response to an intermediate signal and (b) receive a gate to source voltage having a range set at a level to maintain linearity, wherein (i) said first circuit is implemented using a first transistor type and (ii) said first transistor type is configured as an output device capable of providing a breakdown voltage greater than 50 volts; and
   a second circuit configured to generate said intermediate signal in response to (i) an input signal and (ii) a feedback of said output signal, wherein (A) said second circuit is implemented using a second transistor type, (B) said feedback of said output signal is configured to set said range of said intermediate signal to said level to be low enough for reliable operation and (C) said output signal is an amplified version of said input signal.

2. The apparatus according to claim 1, wherein said intermediate signal is presented by a collector of said second circuit.

3. The apparatus according to claim 1, wherein said first transistor type comprises a high breakdown voltage FET.

4. The apparatus according to claim 3, wherein said high breakdown voltage FET comprises pHEMT and HFET devices.

5. The apparatus according to claim 3, wherein said high breakdown voltage FET comprises a gallium nitride transistor.

6. The apparatus according to claim 1, wherein said first transistor type provides voltage amplification.

7. The apparatus according to claim 1, wherein said second transistor type is configured as a low voltage driver.

8. The apparatus according to claim 1, wherein said second transistor type comprises a heterojunction bipolar transistor.

9. The apparatus according to claim 1, wherein said second transistor type provides current amplification.

10. The apparatus according to claim 1, wherein said apparatus improves bandwidth performance by raising input impedance to allow broadband matching.

11. The apparatus according to claim 1, wherein said apparatus is configured in a cascode arrangement.

12. The apparatus according to claim 1, wherein said first circuit and said second circuit are implemented on an integrated circuit package.

13. The apparatus according to claim 1, wherein said apparatus is configured to provide current amplification and voltage amplification on a single integrated circuit package.

14. The apparatus according to claim 13, wherein said current amplification and said voltage amplification are fabricated on different substrates and bonded together using bond wires to implement said single integrated circuit package.

15. The apparatus according to claim 1, wherein said second circuit further comprises a pair of transistors of said second transistor type arranged in a Darlington configuration.

16. The apparatus according to claim 15, wherein said apparatus further comprises a second pair of transistors of said second transistor type arranged in a Darlington configuration, wherein said first and said second transistor pairs are arranged in a Push-Pull configuration.

17. A method for providing an amplified version of an input signal while maintaining linearity, comprising the steps of:
(A) generating an output signal in response to an intermediate signal, wherein (i) a first circuit is implemented using a first transistor type, (ii) said first circuit receives a gate to source voltage having a range set at a level to maintain linearity and (iii) said first transistor type is configured as an output device capable of providing a breakdown voltage greater than 50 volts; and
(B) generating said intermediate signal in response to (i) said input signal and (ii) a feedback of said output signal, wherein (a) a second circuit is implemented using a second transistor type, (b) said feedback of said output signal is configured to set said range of said intermediate signal to said level to be low enough for reliable operation and said output signal is an amplified version of said input signal.

18. An apparatus comprising:
means for generating an output signal in response to an intermediate signal, wherein (i) a first circuit is implemented using a first transistor type, (ii) said first circuit receives a gate to source voltage having a range set at a level to maintain linearity and (iii) said first transistor type is configured as an output device capable of providing a breakdown voltage greater than 50 volts; and
means for generating said intermediate signal in response to (i) an input signal and (ii) a feedback of said output signal, wherein (a) a second circuit is implemented using a second transistor type, (b) said feedback of said output signal is configured to set said range of said intermediate signal to said level to be low enough for reliable operation and (c) said output signal is an amplified version of said input signal.

* * * * *